United States Patent [19]

Ohya et al.

[11] Patent Number: 5,177,752
[45] Date of Patent: Jan. 5, 1993

[54] OPTICAL PULSE GENERATOR USING GAIN-SWITCHED SEMICONDUCTOR LASER

[75] Inventors: Jun Ohya, Osaka; Tetsuo Taniguchi, Kobe, both of Japan

[73] Assignee: Matsushita Electric Industrial Co., Ltd., Osaka, Japan

[21] Appl. No.: 794,619

[22] Filed: Nov. 15, 1991

Related U.S. Application Data

[63] Continuation of Ser. No. 546,907, Jul. 2, 1990, abandoned.

[30] Foreign Application Priority Data

Jun. 30, 1989 [JP] Japan .................... 1-170159

[51] Int. Cl.$^5$ ................ H01S 3/19
[52] U.S. Cl. ................ 372/22; 372/46; 372/50
[58] Field of Search ............ 372/50, 46, 25, 21, 372/22, 45; 307/425

[56] References Cited

U.S. PATENT DOCUMENTS

| | | | |
|---|---|---|---|
| 4,812,776 | 3/1989 | Jasaki | 372/25 |
| 4,815,084 | 3/1989 | Scifres et al. | 372/50 |
| 4,951,293 | 8/1990 | Yamamoto et al. | 372/50 |

FOREIGN PATENT DOCUMENTS 0058378  4/1982  Japan .................... 372/22

OTHER PUBLICATIONS

"Generation of Picosecond Blue Light Pulse by Frequency Doubling of a Gain-Switched GaAlAs Laser Diode Having Saturable Absorber", Ohya et al., IEEE Journal of Quantum Electronics, vol. 27, No. 8, Aug. 1991, pp. 7-15.

"Conditions for Self-Sustained Pulsation and Bistability in Semiconductor Lasers", Masayasu Ueno & Roy Lang, J. Appl. Phys. 58(4), Aug. 15, 1985, pp. 1689-1692.

"High-Peak-Power Picosecond Optical Pulse Generation from Highly RF-Modulated InGaAsP DH Diode Laser", N. Onodera et al., Electronics Letters, Sep. 16, 1982, vol. 18, No. 19, pp. 811-812.

"Picosecond Blue Light Pulse Generation by Frequency Doubling of a Gain-Switched GaAlAs Laser Diode with Saturable Absorbers", Jun Ohya et al., Appl. Phys. Lett. 56(23), Jun. 4, 1990, pp. 2270-2272.

"High Peak Power Picosecond Light Pulses from a Directly Modulated Semiconductor Laser", H. J. Klein et al., Appl. Phys. Lett. 41(5), Sep. 1, 1982, pp. 394-396.

Primary Examiner—James W. Davie
Attorney, Agent, or Firm—Wenderoth, Lind & Ponack

[57] ABSTRACT

Ultrashort optical pulses of a high peak output are generated by gain-switching of a semiconductor laser possessing a current non-injection region with short current pulses. By coupling this semiconductor laser to a wavelength conversion element, a second harmonic wave is generated, and ultrashort optical pulses of a short wavelength and a high peak output are generated.

9 Claims, 6 Drawing Sheets

Light pulse of semiconductor laser

200ps/div

Pulse of second harmonics

200ps/div

OPTICAL PULSE GENERATOR USING GAIN-SWITCHED SEMICONDUCTOR LASER

This application is a continuation of now abandoned application Ser. No. 07/546,907 filed on Jul. 2, 1990 now abandoned.

BACKGROUND OF THE INVENTION

The present invention relates to an optical pulse generator for use in the fields of optical communications, optical information processing, optical measurement, and spectroscopic or physical property measurements of various materials.

Various methods to generate ultrashort optical pulses by using semiconductor lasers are known, such as the active mode locking, passive mode locking, and gain-switching. The methods of active and passive mode locking are described in detail, for example, in Semiconductors and Semimetals, Vol. 22, Part B, Chapter 1. In the active mode locking, the injection current into the semiconductor laser is modulated at the round-trip frequency of the external cavity. In the passive mode locking, a saturable absorber is contained in the cavity. In both methods, optical pulses are generated at the round-trip frequency of the external cavity, and the pulse width of the optical pulses is generally 1 to 20 ps. In the gain-switching method, a semiconductor laser is excited by a short current pulse, and only the first pulse of the relaxation oscillation caused by the transient response of the laser oscillation is picked up to generate a short pulse of light. In this method, a repetitive frequency of the light pulse may be freely adjustable. On the other hand, the generation of ultrashort optical pulses using a semiconductor laser of the wavelength conversion type is reported by T. Taniuchi, K. Yamamoto and G. Tohmon in "Blue and Ultraviolet Emission from Frequency Doubled Diode Lasers" in Proceedings of 1988 LEOS Annual Meeting (Institute of Electrical and Electronics Engineers, New York, 1988), paper VL 2.4. FIG. 8 shows a schematic structural diagram of a conventional wavelength conversion type ultrashort pulse generator, in which element 1 is a semiconductor laser; element 2 is a wavelength conversion element; element 3 is an optical waveguide; elements 4 and 5 are lenses, and element 6 is a half wave plate. A fundamental wave 7 of TE mode oscillation emitted from the semiconductor laser 1 is collimated by the lens 4, and is converted in the polarization direction by 90 degrees in the half wave plate 6, and is focused by the lens 5 to be fed into the optical waveguide 3 formed in the wavelength conversion element 2. At this time, the phase velocity of the fundamental wave propagating through the optical waveguide 3 and that of the second harmonic wave 8 emitted by Cerenkov radiation are equalized, so that the second harmonic wave is generated efficiently. When the semiconductor laser with the wavelength of 0.84 μm is gain-switched by a short current pulse with the pulse width of several hundred ps obtained as an output of a comb generator, a fundamental wave with pulse width of about 20 ps is generated, so that a second harmonic wave of wavelength of 0.42 μm with pulse width of about 10 ps is obtained.

In the active or passive mode locking method of semiconductor laser, since the light output of the semiconductor laser is fed back again to the semiconductor laser through the external cavity, the output cannot be increased sufficiently. Besides, the construction of the apparatus is complicated, and the adjustment is difficult. On the other hand, in the gain-switching method of semiconductor laser, ultrashort light pulses may be generated in a simple construction. However, when the output is subjected to wavelength conversion, it is difficult to heighten the output of the radiated light pulse of the semiconductor laser since the output of the second harmonic wave obtained is small. The output light pulse of the semiconductor laser may be increased by elevating the peak value of the exciting current pulse, but if the pulse width of the current pulse is very small, on the order of several hundreds ps, it is difficult to obtain current pulses of a high peak value.

SUMMARY OF THE INVENTION

In the light of the above problems, hence, it is a primary object of the present invention to provide an ultrashort optical pulse generator capable of heightening the output of the optical pulse emitted from a semiconductor laser without elevating the peak value of the short current pulse used for gain-switching of the semiconductor laser, and also heightening the output of the optical pulse of the second harmonic wave obtained by wavelength conversion of the optical output pulse from the semiconductor laser.

To achieve the above object, the optical pulse generator of the invention comprises a semiconductor laser including a resonant cavity containing at least an active layer, wherein a part of the cavity is a current injection region possessing an electrode for injecting a current into the active layer, while the other part of the cavity is a current non-injection region, and said semiconductor laser is excited by a short current pulse for gain-switching. In addition, this invention also provides an optical pulse generator which comprises an optically coupled structure of the semiconductor laser of the above construction and a wavelength conversion element possessing an optical waveguide structure, wherein the ultrashort light pulse emitted from the semiconductor laser is transmitted to the wavelength conversion element as a fundamental wave, and a second harmonic wave of the fundamental wave is generated as an output light from the wavelength conversion element. A first facet of the resonant cavity of the semiconductor laser may have a highly reflective coating, and a second facet may be an exist and have an anti-reflection coating. The current non-injection region of the semiconductor laser may have a control electrode, and the current non-injection region may be electrically isolated from the current injection region.

DETAILED DESCRIPTION OF THE INVENTION

Figure 1:
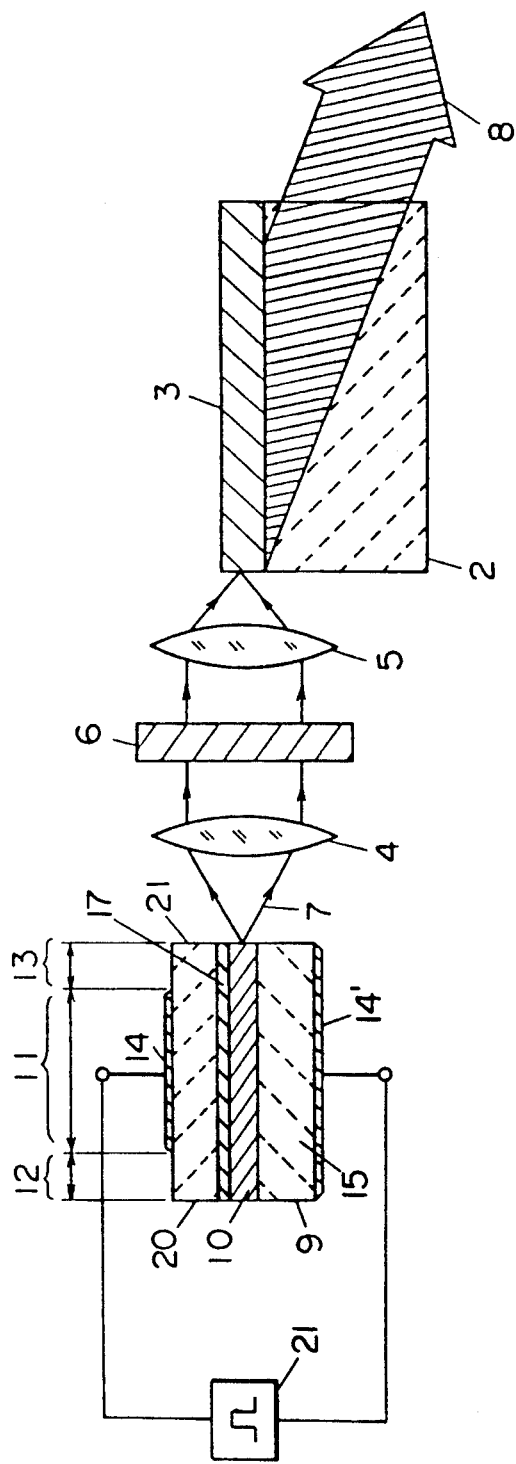
FIG. 1 is a schematic structural diagram of an ultrashort optical pulse generator according to a first embodiment of the present invention.

FIG. 1 shows a schematic strcute of an ultrashort optical pulse generator in accordance with a first embodiment of the present invention, in which element 9 is a GaAlAs/GaAs semiconductor laser with an oscillation wavelength of 0.83 μm. The semiconductor laser 9 includes a GaAlAs active layer 10 and a clad layer 17 formed on a GaAs semiconductor substrate 15. These form a resonant cavity of the semiconductor laser 9. Element 11 is a current injection region disposed at the center position of the resonant cavity with a length of 200 μm; elements 12 and 13 are current non-injection regions disposed outside of the current injection region with a length of 25 μm; elements 14 and 14' are electrodes for injecting current; element 2 is a wavelength conversion element; element 3 is an optical waveguide; elements 4 and 5 are lenses; element 6 is a half wave plate, and element 21 is a bias current source and a short pulse current source. A resonant cavity facet 20 of the semiconductor laser 9 has a high reflectivity of 96% by coating with four layers of $Al_2O_3$ and amorphous Si, while a resonant cavity facet 21 has a low reflectivity of 3% with a single layer coating of $Al_2O_3$. The wavelength conversion element 2 is made by forming an optical waveguide 3 (width × thickness = 1.6 μm × 0.37 μm) by proton exchange with pyrophosphoric acid on a Z-cut $LiNbO_3$ substrate. The fundamental wave 7 emitted from the semiconductor laser 9 is the lowest-order TM waveguide mode, while the harmonic wave 8 radiated from the wavelength conversion element is Cherenkov radiation of the TM radiation mode.

Figure 2:
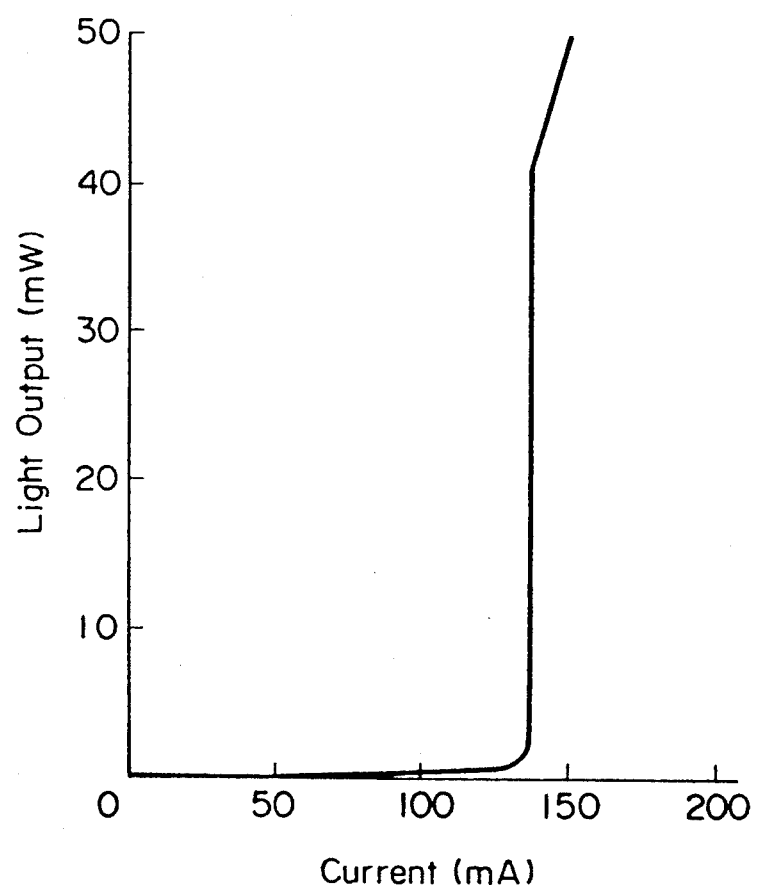
FIG. 2 is a current-optical output characteristic curve of the semiconductor laser of the first embodiment.

FIG. 2 shows a current-light output characteristic of the semiconductor laser 9. By controlling the facet reflectivity, a high light output power of 40 mW or more was obtained. When injecting a bias current of 0.7 times of the threshold current and short current pulse of pulse width of 400 ps and a pulse repetition frequency of 10 MHz from an electrode 14 for gain-switching the semiconductor laser 9, ultra-short optical pulses of high output of more than twice that of the conventional level with a pulse width of 20 ps or less and peak output of 2 W or more were obtained.

In the semiconductor laser possessing a current non-injection region, the current non-injection region acts as a saturable absorber. When a current is injected into the current injection region, the gain of the region increases to cause emission of light, but when the light emission is small, the absorption in the current non-injection region is large and the output light is at low level. As the light emission increases, the absorption in the current non-injection region begins to be saturated, and when exceeding the threshold, the semiconductor laser oscillates to emit ultrashort optical pulses of a high output level. The ultrashort optical pulses of a high output level are obtained by the synergistic effect of an increase of the gain in the current injection region and the lowering of absorption in the current non-injection region due to the saturable absorption effect.

Figure 3:
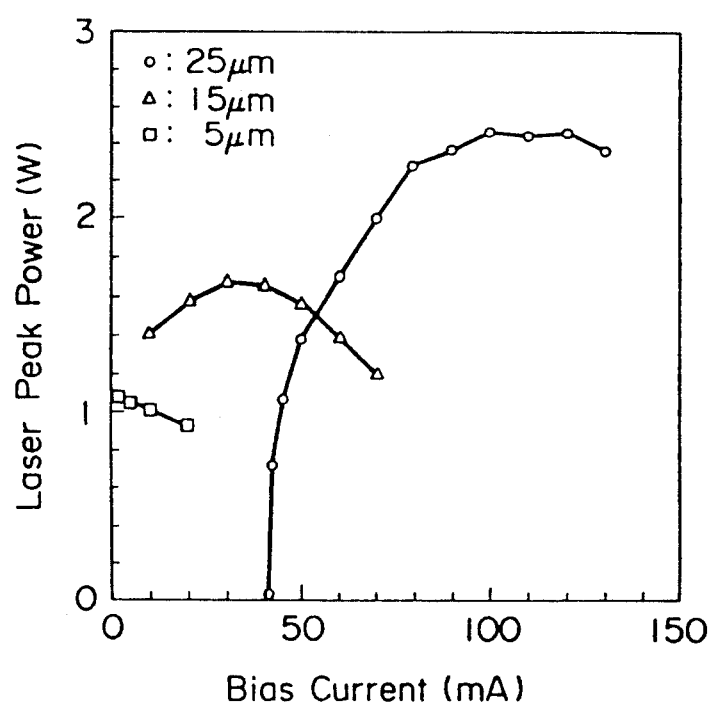
FIG. 3 is a bias current depending diagram of peak output power of semiconductor lasers differing in the length of current non-injection region, FIGS. 4 (a) and a 4 (b) are pulse waveform diagrams of semiconductor laser light and second harmonic wave respectively.

FIG. 3 shows the bias current dependence of the peak output of the semiconductor laser having current non-injection regions of length of 5 μm, 15 μm and 25 μm at outside of the current injection region. As seen from FIG. 3, higher peak output may be obtained when the length of the current non-injection region becomes longer which causes the saturable absorption effect of the current non-injection region to become larger.

When the ratio $l_2/l_1$ of the length $l_2$ of the current non-injection region to that $l_1$ of the current injection region is larger than 0.5, the absorption loss of the current non-injection region becomes so large that laser oscillation cannot be obtained. Therefore, it is preferable that the ratio $l_2/l_1$ may be smaller than 0.5.

Now, referring back to FIG. 1, the optical pulse of TE mode oscillation emitted from the semiconductor laser 9 is transmitted to the lens 4 as a fundamental wave 7 and collimated therein. The output optical pulse from the lens 4 is converted in the polarization direction by 90 degrees in the half wave plate 6, and is then focused through the lens 5 to enter the optical waveguide 3 formed on the wavelength conversion element 2. At this time, the phase velocity of the fundamental wave of the TM waveguide mode propagating through the optical waveguide 3 and that of the second harmonic wave of TM radiation mode are equalized, so that the fundamental wave 7 is converted into an optical pulse 8 of the second harmonic wave with a wavelength of 0.415 μm, and is radiated by the Cerenkov effect. The second harmonic output is converted in proportion to the square of the fundamental wave output, and therefore the second harmonic wave with a pulse width of 10 ps or less and with a peak output of about 10 mW was obtained which is a high output of more than four times the conventional level.

Figure 4A:
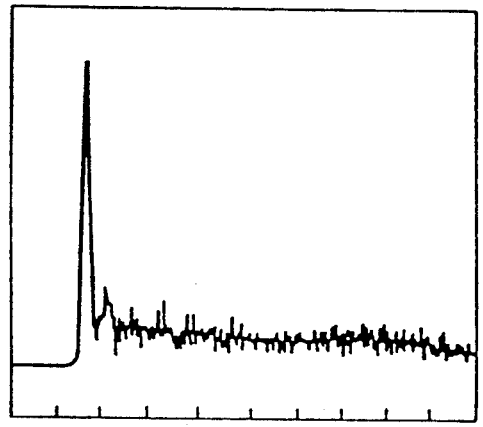
Figure 4B:
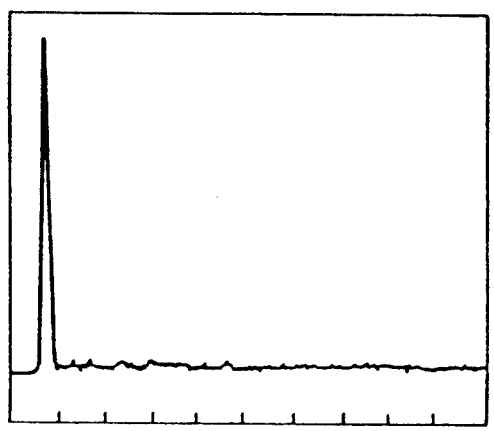

FIGS. 4(a) and 4(b) show the respective optical pulse waveforms of the semiconductor laser and light output and the second harmonic wave output observed by an optical oscilloscope.

Figure 5:
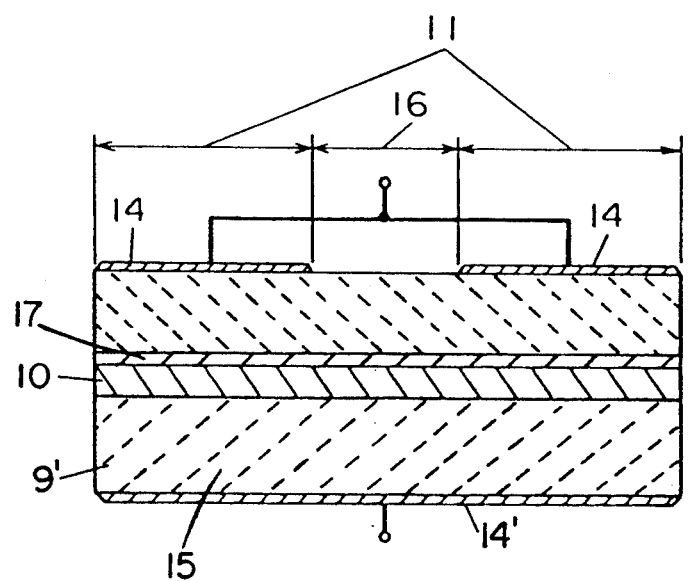
FIG. 5 is a schematic sectional view of a semiconductor laser in accordance with a second embodiment of the present invention.

FIG. 5 shows a schematic sectional view of a semiconductor laser in the ultrashort optical pulse generator according to a second embodiment of the present invention, in which a current non-injection region 16 is disposed at the central part of the resonant cavity of the semiconductor laser 9' and the current injection regions 11 are disposed outside of the current non-injection region. In such laser, since the length of the current non-injection region 16 can be set up by the mask used in the fabrication process, devices having equivalent characteristics are obtained at a high yield from a same wafer.

This semiconductor laser 9' can replace the semiconductor laser 9 of FIG. 1.

Figure 6:
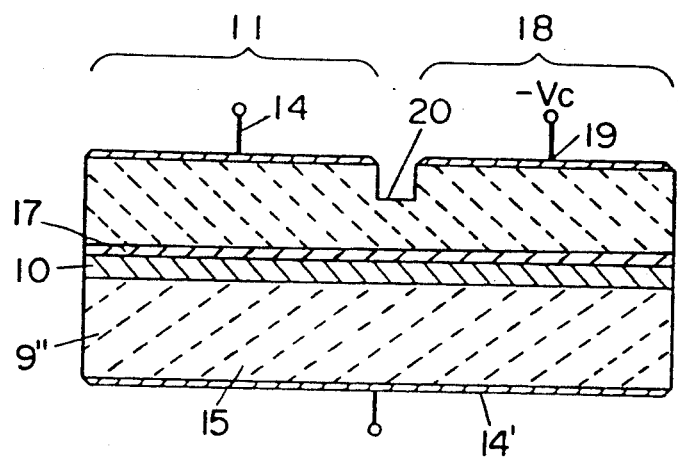
FIG. 6 is a schematic sectional view of a semiconductor laser in accordance with a third embodiment of the present invention.
Figure 7:
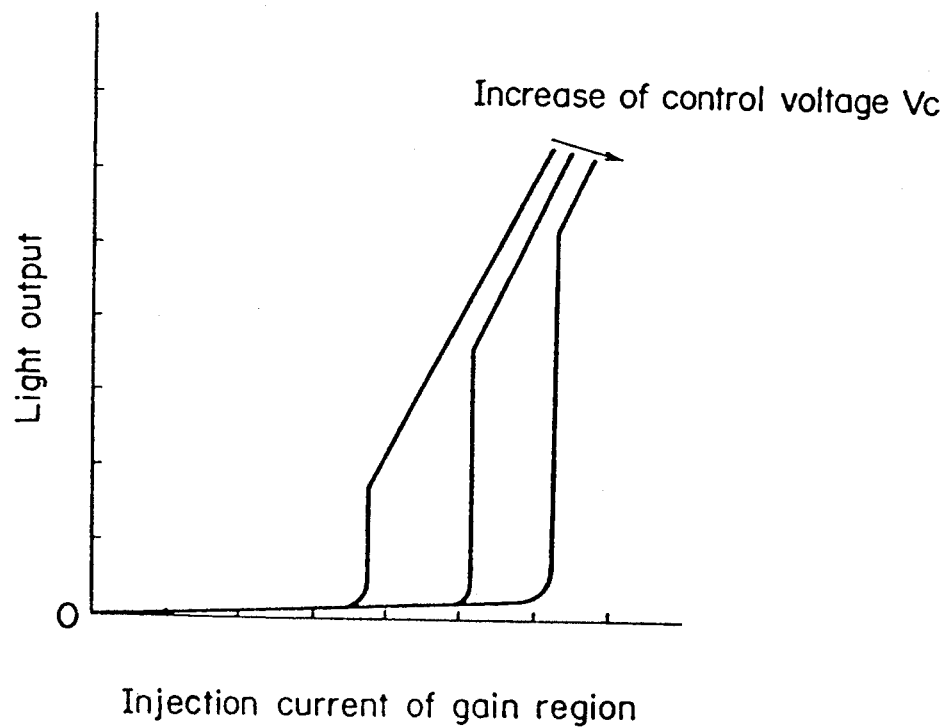
FIG. 7 is a current-optical output characteristic curve of the semiconductor laser in the third embodiment.
Figure 8:
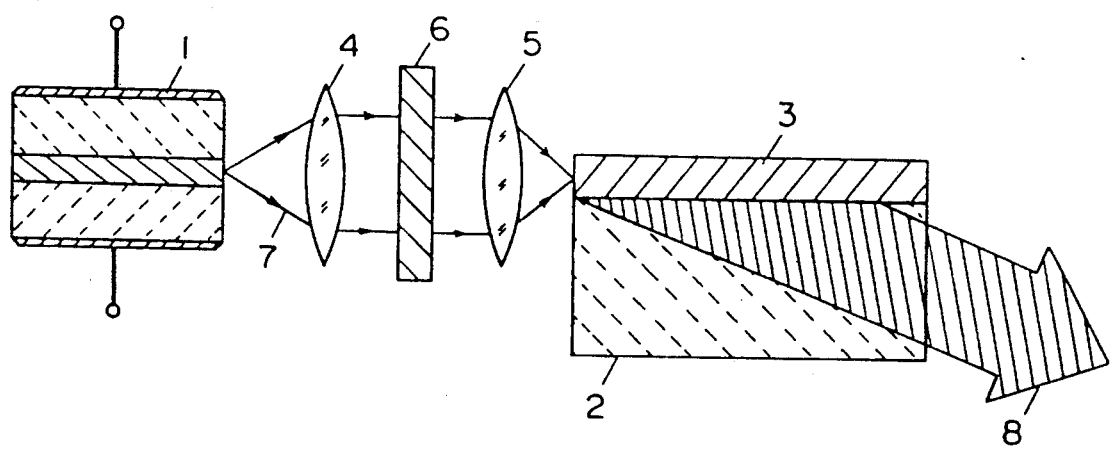
FIG. 8 is a schematic structural diagram of a prior art wavelength conversion type ultrashort pulse generator.

FIG. 6 is a schematic sectional view of a semiconductor laser of the ultrashort optical pulse generator in accordance with a third embodiment of the present invention, in which a control electrode 19 is disposed on the current non-injection region 18 of the semiconductor laser 9'''. The current injection region 11 and the current non-injection region 18 are electrically isolated from each other by forming a groove 20 by etching. FIG. 7 shows the injection current-optical output characteristic in the current-injection region 11 when the reverse bias voltage Vc to the control electrode 19 is varied. When the reverse bias voltage Vc to the control electrode 19 is increased, the absorption coefficient of the current non-injection region becomes larger, and the threshold current increases. To change the reverse bias voltage to the control electrode 19 is similar to changing of the length of the current non-injection region in the semiconductor laser in the first or second embodiment, but when changing the reverse bias voltage, since it is possible to control it continuously, it is possible to control the peak output of the optical pulse to be at a maximum when gain-switching.

This semiconductor laser 9" can also replace the semiconductor laser 9 of FIG. 1.

In the embodiments, meanwhile, the GaAlAs/GaAs compound of the wavelength of 0.8 μm band is used as the semiconductor laser, but the same effect is obtained by using the InGaAsP/InP compound of the wavelength of 1.3 μm band or the wavelength of 1.5 μm band, or the AlGaInP/GaAs compound of the wavelength of 0.6 μm band, and the wavelength conversion type generator may be also available when employing these compounds.

As is clear from the description above, the present invention generates ultrashort optical pulses of large peak output by forming a current injection region and current non-injection region in the semiconductor laser. Moreover, when the optical pulse output of the semiconductor laser is fed into the optical waveguide type wavelength conversion element as fundamental wave, a second harmonic wave in proportion to the square of the output of the fundamental wave is obtained, and hence it is possible to enhance the output of the ultrashort optical pulse of short wavelength which is not realized in conventional semiconductor laser.

We claim:

1. An optical pulse generator for generating ultrashort optical pulses comprising:
   a semiconductor laser having a resonant cavity containing at least an active layer, cladding layer and a pair of electrodes, wherein said resonant cavity includes a current injection region having said pair of electrodes for injecting current into said active layer and a current non-injection region which is devoid of electrodes; a pulse current source for injecting pulse current into said current injection region for generating laser light; and a wavelength conversion element comprising an optical waveguide which is disposed in a surface portion of said wavelength conversion element;
   wherein said optical waveguide is aligned so as to generate a second harmonic wave of a fundamental wave from said optical waveguide, when the fundamental wave is coupled to said optical waveguide and is guided by said optical waveguide;
   whereby a gain in said current injection region increases and an absorption in said current non-injection region decreases in gain-switching manner so as to generate ultrashort optical pulses and whereby said ultrashort optical pulse guided in said optical waveguide serves as a fundamental wave for said wavelength conversion element; and whereby ultrashort optical pulses as the second harmonic wave of the fundamental wave are outputted from said optical waveguide.

2. An optical pulse generator of claim 1, wherein said current injection region is disposed at the center position of said resonant cavity and said current non-injection region is disposed outside of said current injection region.

3. An optical pulse generator of claim 1, wherein said current non-injection region is disposed at the center position of said resonant cavity and said current injection region is disposed outside of said current non-injection region.

4. An optical pulse generator of claim 1, wherein a first facet of said resonant cavity of said semiconductor laser has a highly reflective coating, and a second facet of said semiconductor laser has an anti-reflection coating for emitting laser output light therefrom.

5. An optical pulse generator of claim 1, wherein the ratio of the length of said current non-injection region to length of said current injection region is smaller than 0.5.

6. An optical pulse generator of claim 1, wherein said converting means comprises a $LiNbO_3$ substrate and an optical waveguide.

7. An optical pulse generator of claim 6, wherein said converting means has an optical waveguide which radiates a second harmonic wave of said semiconductor laser due to the Cerenkov effect.

8. An optical pulse generator of claim 6, wherein said means for gain-switching includes a bias current source and a short pulse current source.

9. An optical pulse generator for generating ultrashort optical pulses comprising:
   a semiconductor laser having a resonant cavity containing at least an active layer, a cladding layer and two pair of electrodes, wherein said resonant cavity includes a current injection region having one pair of said two pair of electrodes for injecting current into said active layer and a current non-injection region having said other pair of electrodes for applying a reverse bias voltage to said active layer, wherein said current injection region and said current non-injection region are electrically isolated from each other;
   a pulse current source for injecting pulse current into said current injection region for generating laser light;
   a voltage source for applying a reverse bias voltage to said current non-injection region for controlling the absorption coefficient of laser light; and
   a wavelength conversion element comprising an optical waveguide which is disposed in a surface portion of said wavelength conversion element;
   wherein said optical waveguide is aligned so as to generate a second harmonic wave of a fundamental wave from said optical waveguide, when the fundamental wave is coupled to said optical waveguide and is guided by said optical waveguide;
   whereby a gain in said current injection region increases and an absorption in said current non-injection region decreases in a gain-switching manner so as to generate ultrashort optical pulses and whereby said ultrashort optical pulse guided in said optical waveguide serves as a fundamental wave for said wavelength conversion element; and
   whereby ultrashort optical pulses consisting of the second harmonic wave of the fundamental wave are outputted from said optical waveguide.

* * * * *